United States Patent
Wallaschek et al.

(10) Patent No.: US 6,995,498 B2
(45) Date of Patent: Feb. 7, 2006

(54) CRUCIFORM ULTRASONIC TRANSDUCER

(75) Inventors: Jörg Wallaschek, Paderborn (DE); Piotr Vasiljev, Paderborn (DE); Hans Hesse, Paderborn (DE)

(73) Assignee: Hesse & Knipps GmbH, Paderborn (DE)

( * ) Notice: Subject to any disclaimer, the term of this patent is extended or adjusted under 35 U.S.C. 154(b) by 428 days.

(21) Appl. No.: 10/313,913

(22) Filed: Dec. 6, 2002

(65) Prior Publication Data

US 2003/0168938 A1 Sep. 11, 2003

(30) Foreign Application Priority Data

Dec. 7, 2001 (DE) ......................................... 101 60 228

(51) Int. Cl.
*H01I 41/08* (2006.01)

(52) U.S. Cl. .................. 310/323.18; 310/328; 310/322; 310/323.12

(58) Field of Classification Search ................. 310/328, 310/8.2, 334, 323.18, 323.12, 322; 228/1.1; H01L 41/08, 21/60
See application file for complete search history.

(56) References Cited

U.S. PATENT DOCUMENTS

| 4,854,494 A | | 8/1989 | von Raben |
| 5,377,894 A | * | 1/1995 | Mizoguchi et al. .......... 228/4.5 |
| 5,540,807 A | * | 7/1996 | Akiike et al. ................. 228/1.1 |
| 5,595,328 A | | 1/1997 | Safabakhsh et al. |
| 5,697,545 A | * | 12/1997 | Jennings et al. ......... 228/112.1 |

OTHER PUBLICATIONS

Recent Development of Ultrasonic welding IEEE Nov. 1995 pp. 1051–1060.*
Recent Development of Ultrasonic welding IEEE Nov. 1995 pp. 1051–1060.*

* cited by examiner

Primary Examiner—Thomas M. Dougherty
Assistant Examiner—Karen Addison
(74) Attorney, Agent, or Firm—Herbert Dubno

(57) ABSTRACT

An ultrasonic transducer having an ultrasonic conducting element with a plurality of arms extending from a common junction with some of the arms being provided with ultrasonic generators, at least one other arm carrying a bonding tool, especially for bonding a conductor to a chip and at least two of the arms including a straight angle of 180° with one another.

17 Claims, 5 Drawing Sheets

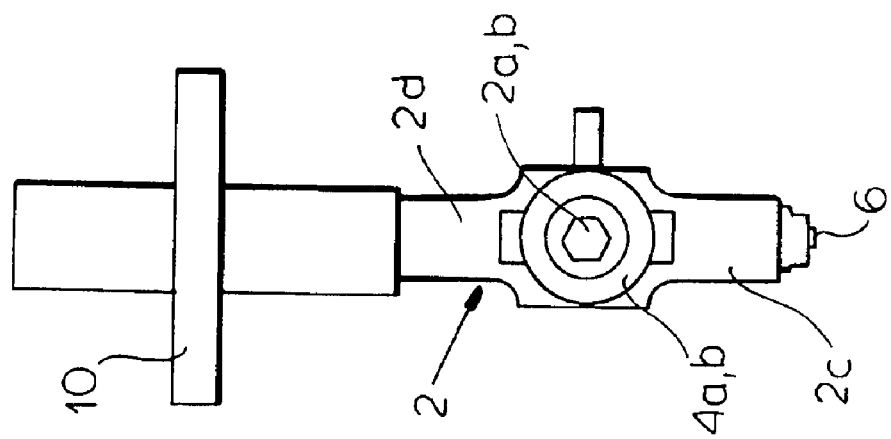
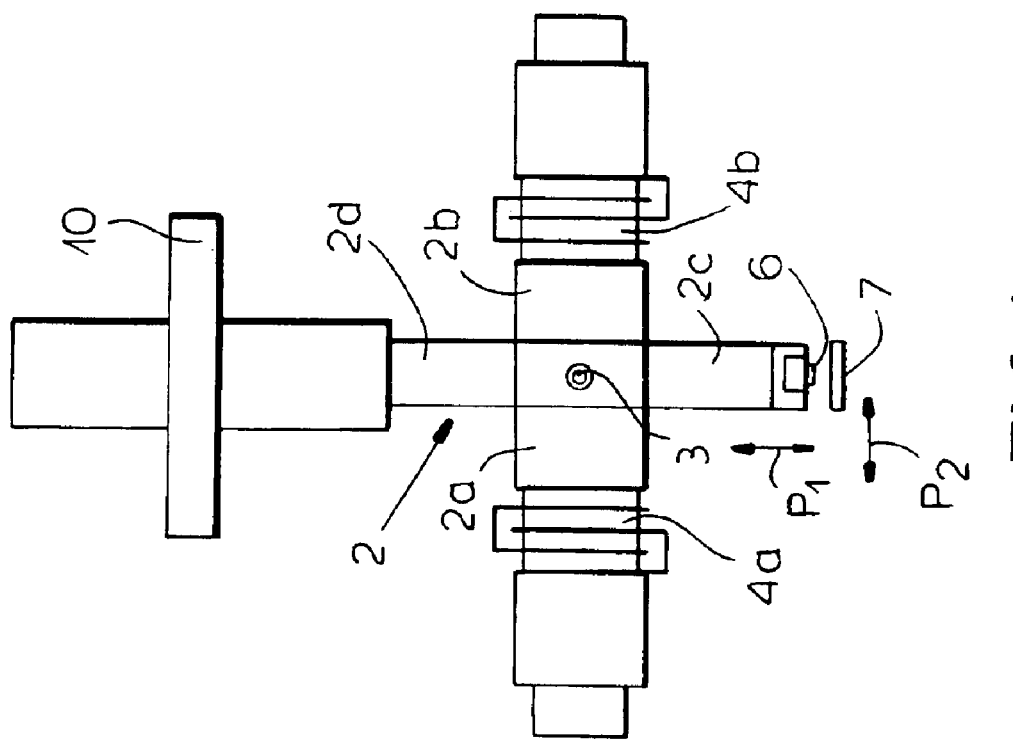

CRUCIFORM ULTRASONIC TRANSDUCER

FIELD OF THE INVENTION

Our present invention relates to an ultrasonic transducer having at least two ultrasonic generators and an ultrasonic conductor to which a tool is connected and which can serve for bonding purposes, particularly for bonding in flip-chip applications or for bonding conductors to semiconductor components. The invention also relates to a method of operating an ultrasonic transducer.

BACKGROUND OF THE INVENTION

Individual ultrasonic transducers are known, for example, from U.S. Pat. No. 5,603,445. A transducer of that type can be used to secure conductors to semiconductor elements and particularly for making connections between semiconductor elements and substrates. To produce the so-called bond connections, at least one ultrasonic generator produces ultrasound which is coupled into one end of an ultrasonic conductor element at an opposite end of which a tool is provided and which through its vibration, can effect a bonding action or the like.

More particularly, the vibrated tool can effect a cold weld connection between a wire and a substrate or semiconductor chip.

A drawback of this system is that it requires an ultrasound horn between the ultrasonic generator, which can be a piezo element or a stack of piezo elements and produces a vibration practically exclusively in a longitudinal direction.

Ultrasonic transducers provided with horns and cold bonding tools at their ends are fastened in the bonding machine in such manner that the tool carrying end must be free to engage in the longitudinal vibration. The vibration, however, is damped at least in part by the end to press that tool against the part to be bonded.

Since the type of vibration cannot be changed, the tool effectively becomes a monodimensional vibrator, e.g. as described in FIG. 1 of the U.S. Pat. No. 5,603,445 patent so that the wire bonding is effected mainly by frictional movement of the tool. The pressure which must be applied by the tool not only results in a detuning of the entire vibration or oscillation system but it can be detrimental when high precision bonds must be made.

In a publication by Jiromaru Tsujino and Hiroyuki Yoshihara in IEEE International Ultrasonics Symposium, Oct. 5–8, 1998, Metropolitan Hotel, Sendai, Japan, an apparatus for ultrasonic bonding is disclosed in which the two longitudinally oscillating ultrasonic systems are arranged at 90° to one another so that an ultrasonic tool extends perpendicularly to both oscillations systems. It is described that with this system a movement of the tool chip can be effected two-dimensionally in a plane parallel to the substrate and also parallel to the plane in which the ultrasonic generators are arranged. A movement in the height direction with respect to the substrate is not described.

OBJECTS OF THE INVENTION

It is the principal object of the present invention to provide an ultrasonic transducer which is capable of imparting two dimensional or three dimensional motions to a bonding tool to thereby facilitate the cold bonding of conductors to semiconductors such as flip-chips in an optimum manner.

Another object of this invention is to provide an improved ultrasonic transducer for ultrasonic bonding which is free from drawbacks of prior art systems.

Still another object of the invention is to provide improved ultrasonic transducers which are easier to use, more efficient and of greater precision than ultrasonic transducers provided heretofore.

Still another object is to provide a method of operating an ultrasonic transducer to effect ultrasonic bonding or a method of ultrasonic bonding using ultrasonic transducers which eliminate disadvantages of earlier systems.

SUMMARY OF THE INVENTION

These objects are attained in accordance with the invention with an ultrasonic transducer comprising:

an ultrasound conductor having at least three arms extending from a common junction; and at least two ultrasound generators each connected to a respective one of the arms for transmitting ultrasound thereto, another of the arms being connectable to an ultrasonically driven tool, at least two of the arms including an angle of 180° with one another.

According to a first aspect of the invention, therefore, the ultrasonic conductor or ultrasonically-conducting elements has at least three arms projecting from a common junction or connection location, and such that at least two of the arms are provided with ultrasonic generators and at least two of the arms are oriented at a straight angle or 180° with respect to one another and at least an arm not provided with such a generator is formed with a tool, especially a tool for cold bonding a conductor onto a chip or substrate or visa versa. This latter arm can be very short as a practical matter and in a limiting condition can have practically zero length so that the tool itself forms this arm.

According to a feature of the invention the arm provided with the tool or forming the tool should form a straight angle (180°) with an arm provided with an ultrasonic generator and the ultrasonic generator can be so arranged that the ultrasound which is produced merges at the junction. This ensures that even if there is an eccentric effect of the ultrasonic wave, the result will be a torsional oscillation at the third arm about its longitudinal axis.

For example, the arm along which the tool is provided can be at an angle especially 90° with the arms carrying the ultrasonic generators so that an ultrasonic generator initially producing longitudinal waves can have those waves spread depending upon the phase positions of the waves and the geometric location of the junction relative to the phase positions of the waves. The common junction, based upon the phase positions, can transmit pure forms of the longitudinal transverse waves or permit the waves to mix and spread and reach the tool as longitudinal or transverse or torsional or mixed waves, the tool extending preferably in an axial direction in the tool arm or forming effectively an extension thereof.

According to a feature of the invention the lengths of the arms can be selected to tune the entire oscillating system as required in the various frequencies of the ultrasonic generators. By means of the opposing ultrasonic generators it is especially simple to produce a resonant standing wave in the two arms between opposing ultrasonic generators and to allow a shifting of the phase and/or a variation in the frequency so that a longitudinal oscillation node occurs at the junction of the arm or to permit the junction to coincide with a crest of the oscillation or some other optional phase position of the standing wave between these extremes.

When an oscillation crest of the longitudinal wave is sustained at the junction, the tool on the arm perpendicular thereto is transversely or laterally moved. In that case, the tool can carry out a frictional welding much like that of classical transverse bonding.

When an oscillation node is maintained at the junction, the tool is longitudinally displaced, i.e. moved up and back with respect to a substrate and one can describe that as resulting in a so-called hammering bonding. With mixed modes at the junction, mixed patterns of movement of the tool can result between these extremes. It is thus possible to provide a tool tip which can be oriented perpendicular to a substrate to be bonded. The bonding process can be controlled in a targeted manner by variation of the phase positions with time or variation of the frequency with time, or both so that during the bonding process, a variety of oscillation modes can be used and the bonding thereby optimized.

The determination as to the phase positions in terms of a node or crest at the junction is in part a consequence of the length ratio of the arms which carry the oscillation generators as is the determination as to whether the ultrasonic waves are in phase or counterphase. By adjustment of the lengths of the operating frequency of the ultrasonic generators with respect to one another, a resonant operation can be ensured for maximum energy transfer.

Of course different ultrasonic generators with different frequencies can be used if different patterns of movement are required at the tool tip. For example, one of the ultrasonic generators may have a frequency which is a multiple of the frequency of the other and, in that case, the phase position at the junction can be varied and higher orders of oscillation can be achieved at the tool tip.

Preferably with the invention at least two arms carrying ultrasonic generators can be provided at a straight angle, i.e. can include an angle of 180° with one another, although additional arm pairs can be provided at a straight angle or any other angular orientation with the first pair. It is possible with the invention to have a pure longitudinal and especially a standing wave or mixed modes or a pure transverse wave and to transition between them by modification of the construction of the excitation of the ultrasonic generators. With two arm pairs and a total of four ultrasonic generators, the arms preferably include angles of 90° with one another, although three pairs of arms can be provided at angles of 60° with one another, especially within a plane.

For example at least two and preferably four arms with ultrasonic generators can be provided in a plane, for example at angles of 90° with one another and each two opposite ultrasonic generators can be electrically excited together, i.e. in a single circuit so that they are electrically connected together and the two oscillation systems provided by the pairs of ultrasonic generators are orthogonal to one another but in a common plane. The arm carrying the tool can be perpendicular to this plane at the common junction of the oscillating arms. By appropriate control of the ultrasonic generators, different vibration wave forms in a plane or outside or perpendicular to the plane can be produced all based upon the phase position at the junction.

By crossing of all of the arms at the common junction, the forces generated can be transferred to the bond at the junction region and thus the force flow can be delivered from the oscillating system to the substrate and conducted to be bonded.

The physical principle that this transduction suggests is based upon the longitudinal stretching of the material such that at the stretching location there is a thinning of the material and conversely there is a compaction. The ratio of stretching to compaction is given by the Poisson ratio or Poisson coefficient.

In a standing longitudinal wave within a material, there is at the oscillation crest a transverse wave perpendicular to the longitudinal wave and at the node a purely longitudinal wave. Between these extremes and at other angels, the wave which is produced in the material is of mixed form. These oscillation modes (crest, node, intermediate modes) can be set in the transducer of the invention by modification of the arms at the common junction so that a resulting oscillation at the tool arm can be controlled. To this send, for example, the arm configuration can be varied where the arms meet at the junction. Preferably the ultrasonically conducting element forming the arm is designed to produce primarily longitudinal oscillations and thus to allow the tool to be subjected to optional variable oscillation modes including those which result from the transmission of longitudinal oscillations.

In an especially appropriate construction the arms forming the ultrasonic conducting elements are at angles of 90 and/or 180° with one another and the ultrasonic conductor itself is T shaped, cruciform or double cruciform or has a part of one of these shapes. The cruciform shape can have more than four arms and those can also be referred to as star shaped. In the double cruciform shape, two additional arms perpendicular to the plane of the cruciform shape may be provided and this can also be referred to as a three-dimensional star shape. Even additional arms can be provided if desired.

The ultrasonic conductor should preferably have an arm which extends away from the tool arm and forms a straight angle of 180° therewith at the junction. This additional arm can be used for tuning the oscillation or wave. The additional arm can, furthermore, either also have an ultrasonic generator or be used to fasten the device in the bonding machine or both.

In a preferred construction all the arms with the exception of that which carries the tool can lie in a common plane.

In order to ensure a hammering action at the tool tip, it is especially advantageous to provide the ultrasonic conductor so that it has at least three arms extending from the junction and that the tool arm is opposite an arm provided with an ultrasonic generator at 180° therewith. One or more other arms can be connected to the junction and can carry ultrasonic generators and they may be oriented at 90° to the tool arm.

Perpendicular to the described plane with at least two orthogonal oscillation or vibration generating systems, each having two oscillation generators oriented at 180° to one another, at least one further oscillation generator can be provided which is oriented perpendicular to this plane and can form a straight angle of 180° with the tool arm. The tool can be thus moved in a highly simple manner in a three-dimensional pattern.

An alternative but likewise simple construction and one which is highly advantageous has two arms oriented at 90° to one another and carrying ultrasonic generators and the tool-carrying arm oriented at a straight angle of 180° to one of these arms. This construction as well can have a T shape, a cruciform shape, a double-cross configuration, a star shape or the like.

In all of these configurations it is advantageous for one of the ultrasonic generators to be arranged on an arm which is at a straight angle of 180° to the arm which carries the tool. By means of this ultrasonic generator, a standing longitudinal wave can be provided in both arms to ensure that a back and forth movement is imparted to the tool and independently of other oscillations or movements which can be superimposed thereon at other angles. This, therefore, ensures hammer-bonding with the tool to secure a conductor to chip. When at least one controlled ultrasonic generator is provided on an arm which is perpendicular to those in which the standing wave is generated, depending upon the phase position at the junction, the longitudinal oscillation at the tool can be amplified, attenuated or can have a transverse movement superimposed thereon.

It is also possible in a simple manner to provide a plurality of ultrasonic generators which drive the tool with the hammer action and which can be provided on a plurality of arms in a plane perpendicular to the longitudinal wave and operated with selected phases or frequencies. In this arrangement the tool can be displaced in an elliptical pattern and simultaneously hammered.

In a further embodiment when an arm forms a straight angle of 180° with the tool-carrying arm, an elastic element, especially a spring element can be provided and can be interposed between the ultrasonic transducer and the tool so that the ultrasonic transducer and the tool can press against the workpiece via that spring element.

The force application can be produced by any optional technique, for example, by contactless technique utilizing electromagnetic fields. The pressing force by means of which the tool is pressed against the workpiece is advantageously applied in all of the embodiments in the production of the longitudinal axis of the arm carrying the tool. As has been described previously, ultrasonic generators are provided on the remaining arms which are perpendicular to this axis so that their effects lie outside the axial force. The arrangement has the advantage that the pressing force can be applied precisely at the bond location and that the oscillation-generating system and the piezo vibration generators do not lie in the force path of the pressing force and thus a detuning of the overall system cannot arise because of the pressing force. Bending processes on the transducer are thus limited.

The system has been found to be especially suitable for flip-chip bonding in which large pressing forces are required.

The ultrasonic transducer can have connecting elements on the ultrasonic conductor by means of which the transducer can be mounted on the machine for producing the bond. In addition the geometry of the ultrasonic conductor can be such that the connection points can also coincide with nodal points for the oscillation. One or more of the arms can serve for that purpose.

An arm can be selected to deliver the pressing force and can include an elastic element or have such a geometry that the pressing force is applied to or through a nodal point so that the energy loss is minimal. The individual arms can have various cross sections designed to obtain optimal amplitude transformations and they can, therefore, have converging patterns in the direction of ultrasonic energy delivery.

The multidimensional movement of the tool chip can also be achieved in the context of the prior description when the individual ceramic member of a piezo stack are locally polarizable and, for example, have different right and left sides with respect to a symmetry plane. With a disk-shape configuration of the individual members the disk segments can be differently polarized and the resulting tilting effect can produce a multidimensional movement.

BRIEF DESCRIPTION OF THE DRAWING

The above and other objects, features, and advantages will become more readily apparent from the following description, reference being made to the accompanying drawing in which:

FIG. 1 is a front elevational view of an ultrasonic transducer embodying the invention;

FIG. 2 is a side elevational view of the transducer of FIG. 1;

SPECIFIC DESCRIPTION

Figure 3:
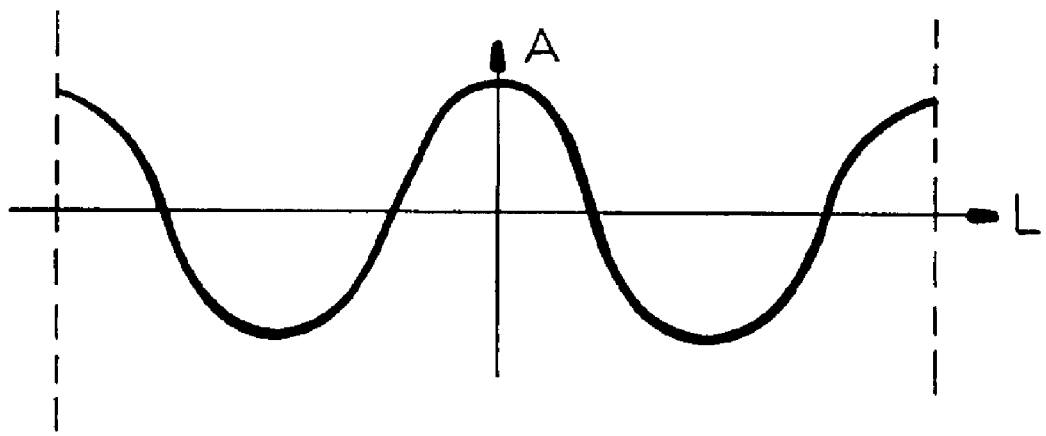
FIG. 3 is a graph of the amplitude versus time of the ultrasonic wave propagated form one of the ultrasonic generators of the embodiment of FIGS. 1 and 2.

FIGS. 1 and 2 show an ultrasonic transducer of cruciform configuration utilizing two ultrasonic generators 4a and 4b mounted on each of two arms, 2a, 2b of an ultrasonic conductor forming the cruciform support generally represented at 2 in FIGS. 1 and 2. The arms 2a and 2b are at an angle of 180° with respect to one another and are at 90° of each of two other arms 2d and 2c. The arms have a common junction at 3. The arm 2c carries an ultrasonic bonding or welding tool 6 which can weld a contact or conductor to a substrate or chip 7, e.g. for flip chip technology.

The arms 2c and 2c are vertically disposed and the arm 2d can serve for connection to the transducer 2a support 10 and/or for tuning purposes. The junction 3 can be, depending upon the phase and frequency of the respective waves produced by the ultrasonic generators 4a and 4b, a node point (FIG. 4) or a crest (FIG. 3) so that in the arm 2c a transverse wave or a longitudinal wave or waves of mixed wave form can be delivered to the tool 6 to set the latter in ultrasonic vibration and effect bonding at the chip 7.

Figure 4:
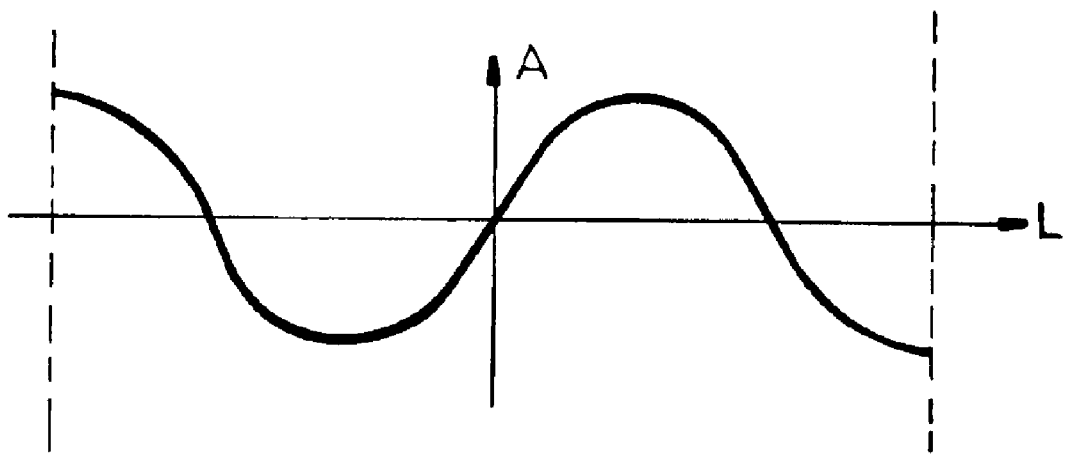
FIG. 4 is a graph of the ultrasonic wave of the other ultrasonic generator.

When a wave crest occurs at the junction 3, a transverse or lateral oscillation of the tool 6 occurs corresponding to the arrow $P_2$ in FIG. 1. When the junction 3 corresponds to a node as shown at FIG. 4, a longitudinal wave is produced in the arms 2c and 2c so that the motion at the tool 6 is an up and down motion corresponding to the double-headed arrow $P_1$ to produce a hammering bond between the contact and the chip 7 lying below the tool. With other wave patterns, a superimposition of the ultrasonic waves can be seen at the junction 3 and can be transmitted correspondingly to the arm 2c and the tool 6. The transducer can be mounted at 10 in a decoupling mount or socket which receives the free arm 2d. This socket can be a circular socket and can be connected by a ring clamp to the bonding machine and can slidably receive the arm 2d with a snug fit.

Figure 5:
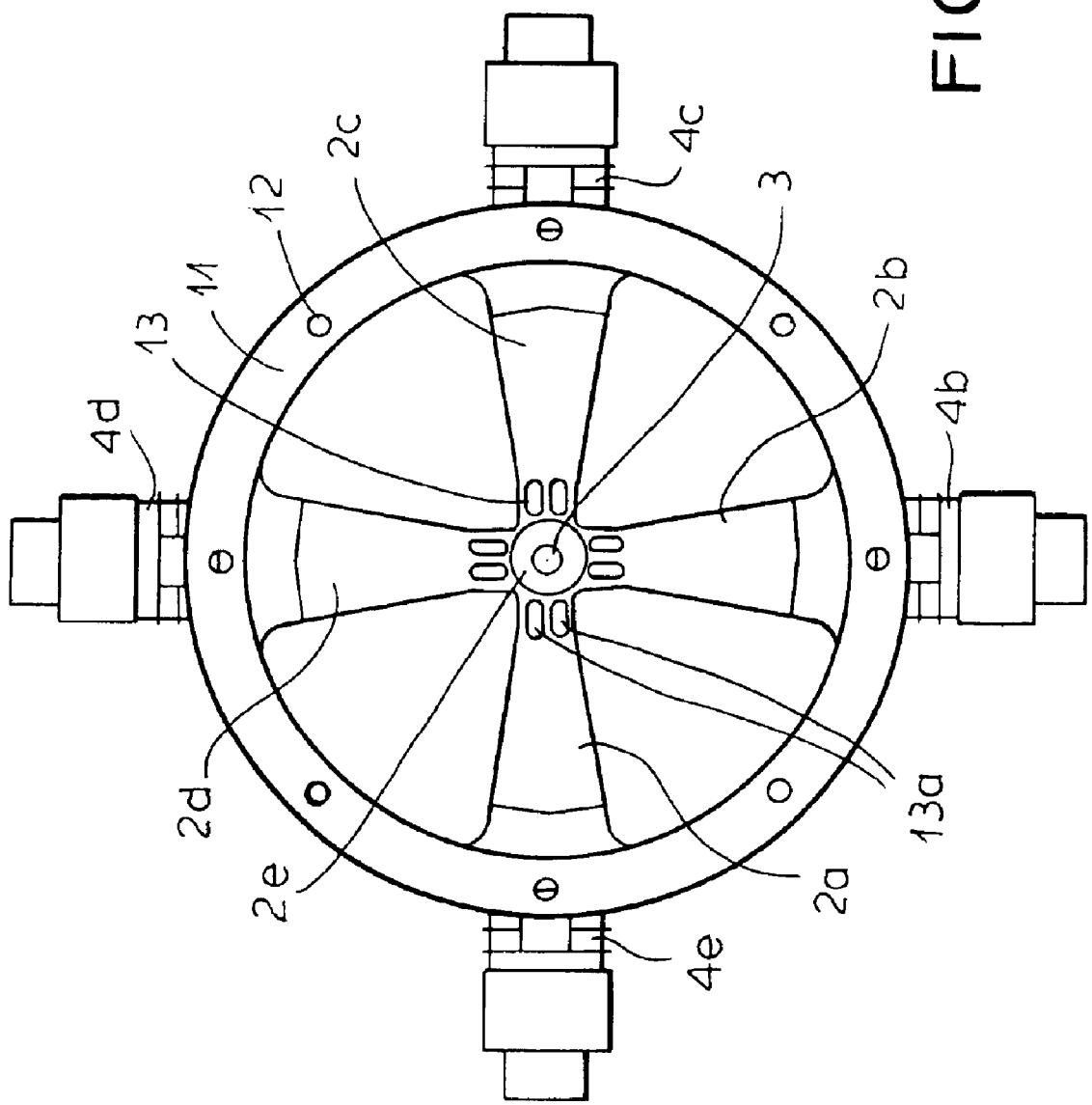
FIG. 5 is a bottom plan view of a second embodiment of an ultrasonic transducer according to the invention.
Figure 6:
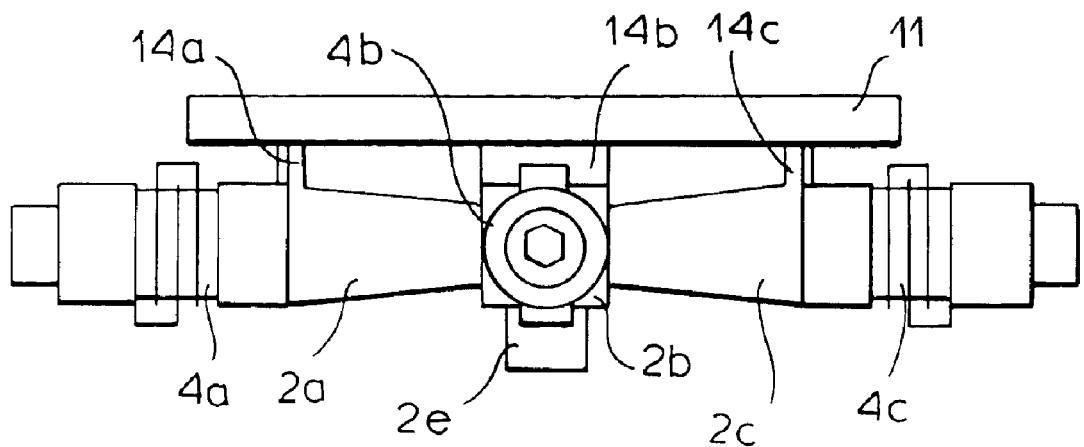
FIG. 6 is a side elevational view of this second embodiment.

While in the embodiment of FIGS. 1 and 2, two ultrasonic generators are provided in the ultrasonic transducer of FIGS. 5 and 6, four ultrasonic generators 4a, 4b, 4c and 4d are provided in a common plane, each at the end of one of the arms 2a, 2b, 2c, 2d oriented at right angles to one another such that the arms 2a and 2c lie at 180° to one another and the arms 2b and 2d also form an angle of 180° with one another.

Perpendicular to the plane of these arms, a fifth arm 2e is set between the arms 2a–2d and extends vertically at a right angle to all of the arms 2a–2d and thus perpendicular to the common plane as well. The arm 2e is located at the common junction for all five arms.

The arm 2e can carry the ultrasonic bonding tool.

The transducer can be mounted parallel to the bonding plane which is parallel to the plane of the arm 2a–2d and a tool in the bonding plane will describe Lissajous figures. At different frequencies, especially frequencies in the ultrasonic generators which may be multiples of one another, Lissajous figures of higher order may be obtained. To concentrate the oscillations generated by the ultrasonic generators 4a–4d, the individual arms 2a–2d converge toward the common junction 3.

Within each of the arms 2a–2d in the region of the common junction 3, at least one cutout 13 can be provided which serves for decoupling oscillations which are orthogonal to the longitudinal direction of the respective arm. In the illustrated embodiment each arm has two such cutouts or recesses 13 which are elongated in the longitudinal direction of the respective arm and define ribs 13a between them and between the edges of the arms and the respective recesses. These recesses increase the stiffness of the arms in the longitudinal direction and prevent waves perpendicular thereto from spreading. The spreading of the waves in a direction perpendicular to the arms is limited in that in this direction the rib functions somewhat as a flexible or hinge-like joint.

Each two ultrasonic generators 4a and 4c or 4b and 4d, associated with arms that are directly opposite one another and thus include angles of 180° with one another can preferably be electrically excited together, i.e. connected in series or in parallel to a common excitation source since the paired ultrasonic generators form respective oscillation systems and the overall transducer then has two orthogonal oscillation systems.

The individual arms are connected together by a ring 11 which lies in a plane parallel to the plane of the arms 2a–2d. The connections between the ring 11 and each of the arms 2a, 2b, 2c is effected via a rib 14a, 14b, 14c which is preferably located at an oscillation node in the respective arm 2a, 2b, 2c, 2d.

The ring 11 is provided with bores 12 by means of which the ring and thus the transducer may be affixed to a bond machine, e.g. via screws.

Figure 7:
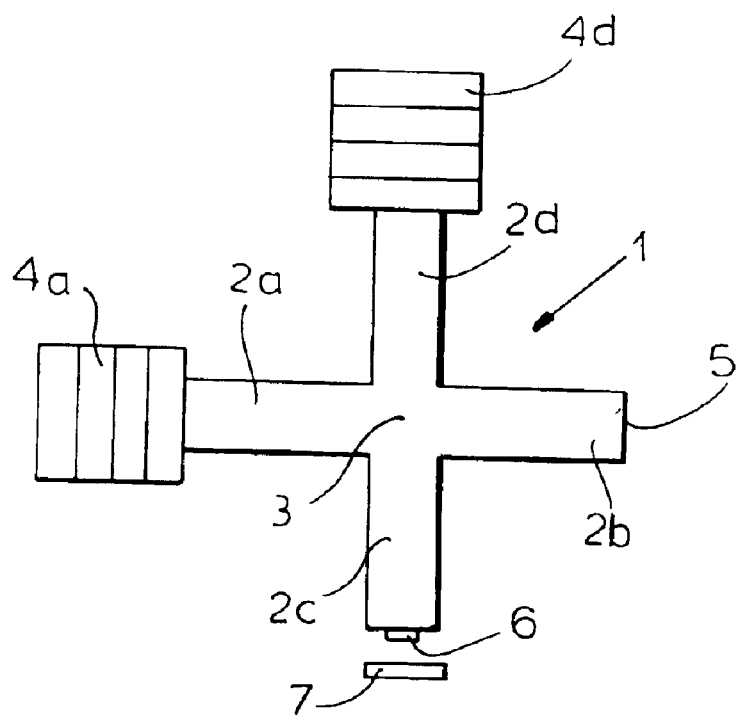
FIG. 7 is a side elevational view of a third embodiment of the ultrasonic transducer.

FIG. 7 illustrates another aspect of the invention and the principle of multidimensionality in an embodiment with four arms. Here the four arms 2a, 2b, 2c and 2d have a cruciform pattern with a common junction at 3 and with the arms 2a, 2b and the arms 2c, 2d forming angles of 180° with one another and the arms 2a and 2d including an angle of 90° with one another.

The arms 2a and 2d carry the ultrasonic generators 4a and 4d so that at the junction 3 the vibrations mix as they are transmitted to arm 2c and are transmitted thereby to the tool 6 which effects bonding at the chip 7. The ultrasonic generator 4d transmits a longitudinal wave to the tool 6 and thus vibrates the latter ultrasonically in an up and down mode. The ultrasonic generator 4a, depending on the phase position of its wave at the junction 3, can provide an amplification or attenuation of the longitudinal oscillation transmitted to the tool 6 and/or can superimpose a transverse oscillation thereon whereby the tool, in addition to undergoing up and down vibration is laterally vibrated.

On a free end 5 of the arm 2b, which in the illustration shown in FIG. 7 is a free end, a third ultrasonic generator can be provided to contribute additional vibrating modes at the tool 6.

Figure 8:
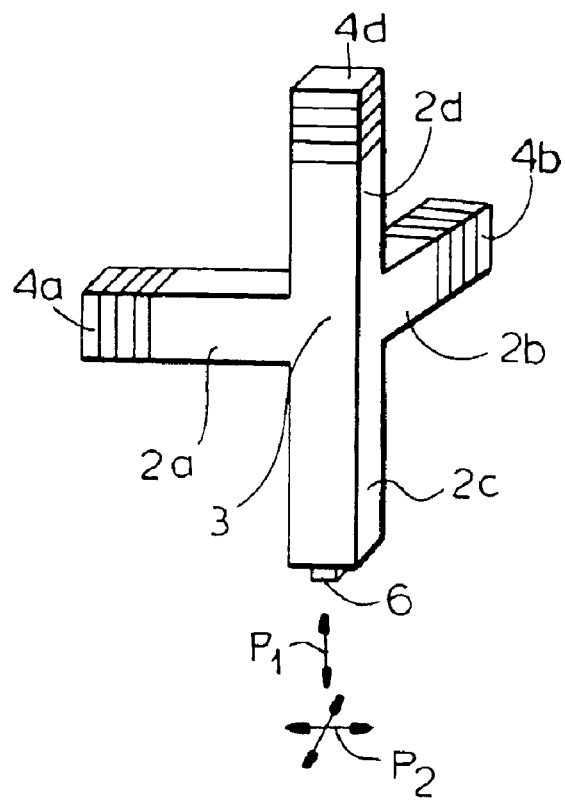
FIG. 8 is a perspective view of a fourth embodiment.

FIG. 8 shows a further embodiment of the invention with two ultrasonic generators 4a and 4b which lie in a common plane but are mounted on arms 2a and 2b which are oriented at 90° to one another. Extending out of this plane are arms 2c and 2d, also meeting at the junction point 3 and including a straight angle of 180° with one another.

The arm 2d, which is orthogonal to the arms 2a and 2b also is provided with an ultrasonic generator while the arm 2c carries the welding tool 6.

The arrangement of FIG. 8 is similar functionally to that of FIG. 7 where an additional ultrasonic generator is provided, at a right angle to the ultrasonic generator 4a.

The ultrasonic generator 4d contributes vibration in the vertical direction, i.e. the up and down vibration of the double-headed arrow $P_1$ while the ultrasonic generators 4a and 4b contribute to mutual perpendicular vibration modes represented by the double-headed arrows $P_2$ so that a three-dimensional vibration of the tool 6 is ensured. The distribution of the ultrasonic energy in a multiplicity of spatial directions and is particularly advantageous for bonding with chips which are highly sensitive. The apparatus has been found to be effective for the bonding of semiconductors whether they be flip-chip or wire bonds and can provide a multidimensional operation with application of force without giving rise to a detuning of the oscillating system.

Figure 9:
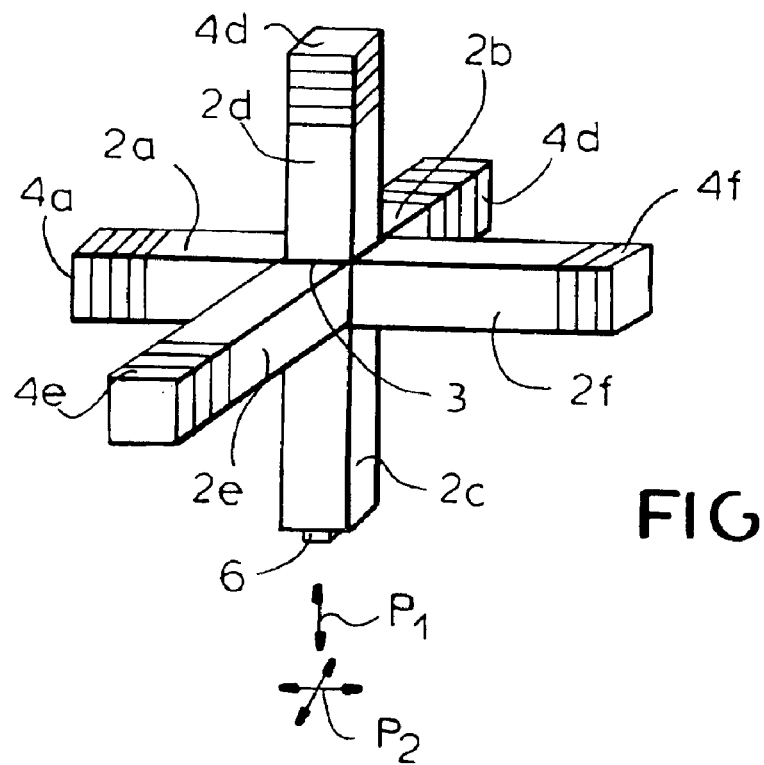
FIG. 9 is a perspective view showing still another embodiment.

In FIG. 9 we have shown still another embodiment of a double cross shape in which, in addition to the arms 2a, 2b, 2c and 2d mentioned with respect to FIG. 8, arms 2e and 2f are provided with ultrasonic transducers 4e and 4f to contribute additional modes of vibration. The arms 2a and 2f are aligned and form a straight angle and the arms 2b and 2e are aligned and form a straight angle. The ultrasonic generators 4a and 4f can be electrically energized together as can the ultrasonic generators 4b and 4e. All of the ultrasonic generators can be Hall-effect ultrasonic generators or piezoelectric ultrasonic generators.

We claim:

1. An ultrasonic transducer assembly comprising:
    an ultrasound conductor having at least three arms extending from a common junction; and
    at least two ultrasound generators each connected to a respective one of said arms for transmitting ultrasound thereto; and
    an ultrasonically driven tool connected to another of said arms, the arm connected to said tool forming an angle of 180° with one of the arms connected to an ultrasound generator and at least one further arm connected to an ultrasound generator forming an angle of 90° with said arm connected to said tool.

2. The ultrasonic transducer assembly defined in claim 1 wherein said ultrasound conductor is generally T shaped.

3. The ultrasonic transducer assembly defined in claim 2 wherein said ultrasound conductor is generally cruciform.

4. The ultrasonic transducer assembly defined in claim 2 wherein said ultrasound conductor is generally of a double-cross shape.

5. An ultrasonic transducer comprising:
    an ultrasound conductor having at least three arms extending from a common junction; and
    at least two ultrasound generators each connected to a respective one of said arms for transmitting ultrasound thereto, another of said arms being connectable to an ultrasonically driven tool, at least two of said arms including an angle of 180° with one another the arms with ultrasound generators lying in a common plane and being interconnected by a ring forming a fastening element.

6. The ultrasonic transducer assembly defined in claim 1, further comprising at least one other arm carrying an ultrasound generator at 90° to the arms including said angle of 180° with one another at said common junction.

7. The ultrasonic transducer assembly defined in claim 1 wherein two arms carrying said ultrasound generators are at 90° to one another and to the arms including said angle of 180° with one another.

8. The ultrasonic transducer assembly defined in claim 1, further comprising a spring in line with the arms including an angle of 180° with one another and between one of said ultrasound generators and said tool for pressing said tool against a workpiece.

9. The ultrasonic transducer assembly defined in claim 1, further comprising means for connecting at least one arm extending from said common junction as a connecting element to a machine for forming a bond between a conductor and a chip.

10. The ultrasonic transducer assembly defined in claim 9 wherein said connecting element is affixed to said ultrasound conductor at a node in ultrasound generated in said conductor.

11. The ultrasonic transducer assembly defined in claim 9 wherein the arm provided with said connecting element has an ultrasound generator affixed thereto.

12. The ultrasonic transducer assembly defined in claim 1 wherein at least one of said arms has a converging cross section.

13. The ultrasonic transducer assembly defined in claim 1 wherein arms provided with ultrasound generators have cross sections converging to said common junction.

14. The ultrasonic transducer assembly defined in claim 1 wherein at least some of said arms are provided with recesses for decoupling oscillations in selected spatial directions.

15. The ultrasonic transducer assembly defined in claim 1 wherein said ultrasound conductor has four arms extending in a common plane around said common junction and in two pairs of arms aligned along a straight angle of 180° with each pair of arms being at an angle of 90° to the other pair, each of the arms of the pair being formed with a respective ultrasound generator.

16. The ultrasonic transducer assembly defined in claim 15 wherein the ultrasound generators of each pair are electrically excited in common.

17. The ultrasonic transducer assembly defined in claim 16 wherein the arm carrying said ultrasonically driven tool is at 90° to said plane.

\* \* \* \* \*